US012027395B2

(12) United States Patent
Kim et al.

(10) Patent No.: US 12,027,395 B2
(45) Date of Patent: Jul. 2, 2024

(54) METHOD AND APPARATUS FOR MEASURING DISPLACEMENT OF AN END EFFECTOR

(71) Applicant: SK ENPULSE CO., LTD., Gyeonggi-do (KR)

(72) Inventors: Nam In Kim, Gyeonggi-do (KR); Jin Sung Park, Gyeonggi-do (KR); Keun Young Song, Gyeonggi-do (KR); In Cheol Kim, Seoul (KR); Byoung Guk Seo, Chungcheongnam-do (KR); Il Sung Kim, Gyeonggi-do (KR); Soung Sun Park, Gyeonggi-do (KR); Ei Sam Jeong, Gyeonggi-do (KR)

(73) Assignee: SK ENPULSE CO., LTD., Gyeonggi-Do (KR)

( * ) Notice: Subject to any disclaimer, the term of this patent is extended or adjusted under 35 U.S.C. 154(b) by 390 days.

(21) Appl. No.: 17/349,149

(22) Filed: Jun. 16, 2021

(65) Prior Publication Data
US 2021/0391196 A1 Dec. 16, 2021

(30) Foreign Application Priority Data
Jun. 16, 2020 (KR) .................. 10-2020-0072792

(51) Int. Cl.
*B25J 11/00* (2006.01)
*B25J 13/08* (2006.01)
(Continued)

(52) U.S. Cl.
CPC ..... *H01L 21/67259* (2013.01); *B25J 11/0095* (2013.01); *B25J 13/089* (2013.01); *H01L 21/67201* (2013.01); *H01L 21/68707* (2013.01)

(58) Field of Classification Search
CPC ......... H01L 21/67259; H01L 21/67201; H01L 21/68707; B25J 11/0095; B25J 13/089
See application file for complete search history.

(56) References Cited

U.S. PATENT DOCUMENTS

| 2005/0102064 A1* | 5/2005 | Donoso ............. H01L 21/67259 |
| | | 700/254 |
| 2009/0182454 A1* | 7/2009 | Donoso ................ H01L 21/681 |
| | | 700/254 |

(Continued)

FOREIGN PATENT DOCUMENTS

| CN | 101551573 A | 10/2009 |
| CN | 104756243 A | 7/2015 |

(Continued)

OTHER PUBLICATIONS

Office action issued on Mar. 28, 2024 from China Patent Office in a counterpart China Patent Application No. 202110665767.6 (all the cited references are listed in this IDS.) (English translation is also submitted herewith.).

*Primary Examiner* — Manuel A Rivera Vargas
(74) *Attorney, Agent, or Firm* — The PL Law Group, PLLC

(57) ABSTRACT

A method for measuring displacements of an end effector passing through a load lock gate of semiconductor equipment according to an embodiment of the present disclosure includes measuring a first displacement in a vertical direction and a second displacement in a horizontal direction of the end effector while the end effector passes through the load lock gate, calculating changes in pitch and roll of the end effector based on the measured first displacement, and calculating a change in yaw of the end effector based on the measured second displacement.

12 Claims, 10 Drawing Sheets

(51) Int. Cl.
*H01L 21/67* (2006.01)
*H01L 21/687* (2006.01)

(56) References Cited

U.S. PATENT DOCUMENTS

| | | |
|---|---|---|
| 2010/0256811 A1 | 10/2010 | Fujii |
| 2015/0287625 A1 | 10/2015 | Fujimoto et al. |
| 2018/0262133 A1 | 9/2018 | Weber et al. |
| 2021/0125851 A1* | 4/2021 | Shivanna ............... B25J 9/1697 |

FOREIGN PATENT DOCUMENTS

| | | |
|---|---|---|
| CN | 105823441 A | 8/2016 |
| CN | 107845594 A | 3/2018 |
| CN | 108120400 A | 6/2018 |
| CN | 109269422 A | 1/2019 |
| EP | 1 463 106 A1 | 9/2004 |
| JP | 2018-0179573 A | 11/2018 |
| KR | 10-2009-0105819 A | 10/2009 |
| KR | 10-1082422 B1 | 11/2011 |
| KR | 10-2014-0019711 A | 2/2014 |
| KR | 10-2018-0031478 A | 3/2018 |

* cited by examiner

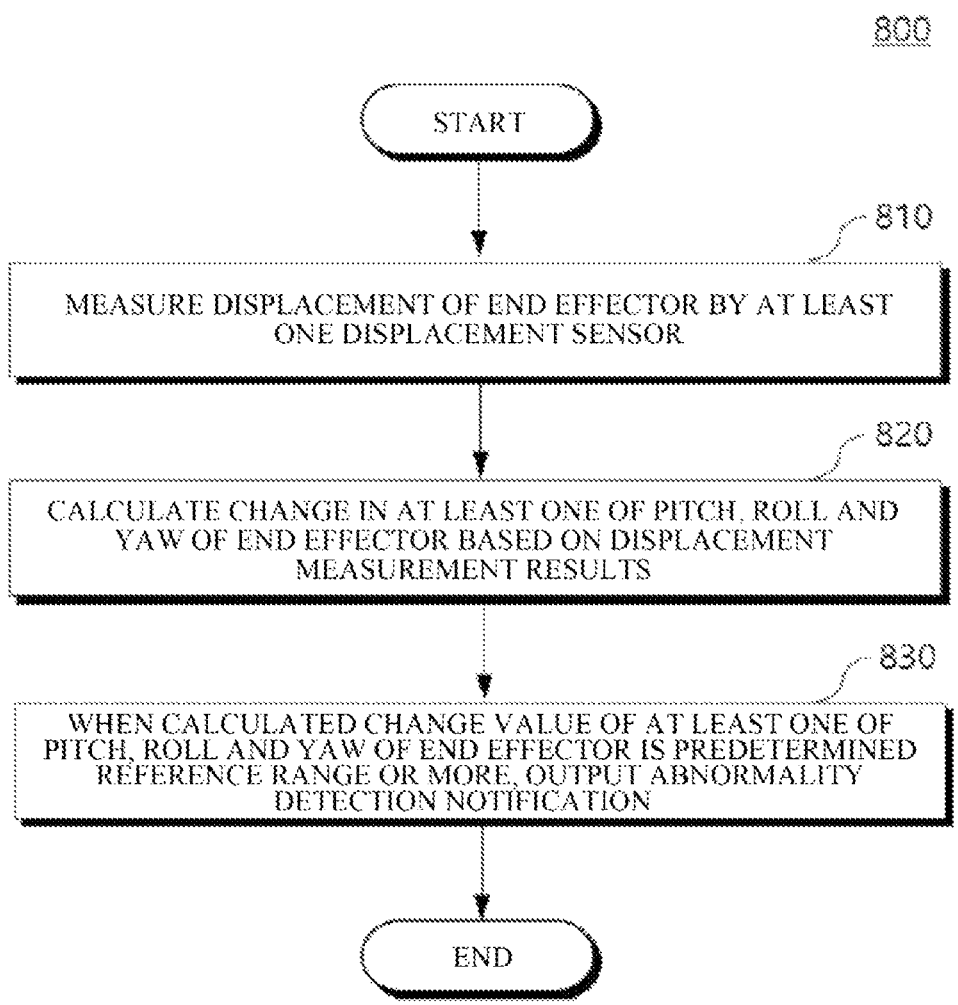

METHOD AND APPARATUS FOR MEASURING DISPLACEMENT OF AN END EFFECTOR

CROSS-REFERENCE TO RELATED APPLICATION(S)

This application claims priority to Korean Patent Application No. 10-2020-0072792 filed on Jun. 16, 2020, in the Korean Intellectual Property Office (KIPO), the entire disclosure of which is incorporated by reference herein.

BACKGROUND

1. Field

The technical idea of the present disclosure relates to a method and an apparatus for measuring displacements of an end effector, and more particularly, to a method and an apparatus for measuring displacements of an end effector, which are capable of calculating changes in positions of the end effector through displacement sensors installed in a load lock gate.

2. Description of the Related Art

FIG. 1 is a diagram for describing a semiconductor process system using a typical wafer. As shown in FIG. 1, the semiconductor process system may include semiconductor equipment such as a load port 10, an equipment front end module (EFEM) 20, a semiconductor process apparatus 30 and the like. This semiconductor process system stores wafers inside enclosed storage pods called a front opening unified pod (FOUP) 11, fixes them on the load port 10, and transfers the wafers stored in the FOUP 11 to the semiconductor process apparatus 30 using the EFEM 20 to perform processing on the wafers.

The EFEM 20 has a wafer transfer chamber in which a wafer transfer apparatus is installed, and the load port 10 coupled to the FOUP 11 is connected to one side of the wafer transfer chamber. In addition, the semiconductor process apparatus 30 is connected to the other side of the wafer transfer chamber of the EFEM 20 through a load lock gate 23, and the wafer 12 stored in the semiconductor FOOP 11 is transferred to the semiconductor process apparatus 30 through a robot arm 21 and an end effector 22 installed at an end thereof, or the wafer 12 that has been processed in the semiconductor process apparatus 30 is transferred into the FOUP 11.

The semiconductor process apparatus 30 includes load locks 31, process chambers 32, a robot arm 33, etc., and transfers the wafer 12 loaded on the load lock 31 through the robot arm 21 and the end effector 22 to the process chamber 32 through the robot arm 33 to allow processing to be performed.

However, in this semiconductor process system, due to sagging of chains and belts constituting joints of the robot arm 21, the end effector 22 for transporting the wafer 12 sags downward compared to the existing installation status, or when it is distorted in one direction, there is a risk that the end effector 22 collides with the load lock 31 or the load lock gate 23 while loading the wafer 12 on the load lock 31 or taking the wafer 12 out of the load lock 31, thereby resulting in a damage to the wafer 12 or occurring particles.

In order to solve the above-described problems, Korean Patent Registration Publication No. 10-1613135, entitled position detection apparatus and position detection method for a semiconductor substrate, discloses a position detection apparatus which accurately detects coordinates of a center position of a disk-shaped substrate from image data photographed by cameras, calculates an amount of position shift on a support member of the disk-shaped substrate being conveyed during processing, and performs position correction so that the substrate can be placed in the correct placement position.

However, there are problems that, since the position detection apparatus according to the prior art uses the cameras, the configuration is complicated and the size of the apparatus is increased, and by calculating the coordinates of the center position of the substrate using data extracted from the image data, a data calculation process is complicated.

SUMMARY

By the technical idea of the present disclosure, it is a technical problem of the present disclosure to provide a method and an apparatus for measuring displacements of an end effector, which may more simply, objectively and accurately calculate changes in positions of the end effector.

The technical problem to be achieved by the method and apparatus for determining the status of a robot of the technical idea of the present disclosure is not limited to the problems described above, and other problems not described above will be clearly understood by those skilled in the art from the following descriptions.

According to an aspect of the present disclosure, there is provided a method for measuring displacements of an end effector passing through a load lock gate of semiconductor equipment, the method including: measuring a first displacement in a vertical direction and a second displacement in a horizontal direction of the end effector while the end effector passes through the load lock gate; calculating changes in pitch and roll of the end effector based on the measured first displacement; and calculating a change in yaw of the end effector based on the measured second displacement.

The step of measuring the first displacement and the second displacement may include: measuring the first displacement by a first displacement sensor installed on an upper surface or a lower surface of the load lock gate; and measuring the second displacement by a second displacement sensor installed on a lateral surface of the load lock gate.

The first displacement sensor may be installed on the upper surface or the lower surface of the load lock gate to measure a vertical displacement on one side of the end effector in a width direction, and the second displacement sensor may be installed on a lateral surface far from the first displacement sensor among both lateral surfaces of the load lock gate.

In the step of calculating the change in the pitch and the roll of the end effector, the change in the pitch (Pitch(θ)) may be calculated by Equation 1 below:

$$\text{Pitch}(\theta) = \sin^{-1}(b/a) \quad \text{[Equation 1]}$$

wherein, 'a' may denote a detection distance from a point in time when the detection of the end effector by the first displacement sensor starts to a point in time when the detection ends, and 'b' may denote a maximum value of the first displacement.

In the step of calculating the change in the pitch and the roll of the end effector, the change in the roll (Roll(θ)) may be calculated by Equation 2 below:

$$\text{Roll}(\theta) = \tan^{-1}(c/b) \quad \text{[Equation 2]}$$

wherein, 'c' may denote a horizontal distance between the first displacement sensor and the second displacement sensor, and 'b' may denote a maximum value of the first displacement.

In the step of calculating the change in the yaw of the end effector, the change in the yaw (Yaw(θ)) may be calculated by Equation 3 below:

$$\text{Yaw}(\theta) = \sin^{-1}(e/d) \qquad \text{[Equation 3]}$$

wherein, 'd' may denote a detection distance from a point in time when the detection of the end effector by the second displacement sensor starts to a point in time when the detection ends, and 'e' may denote a maximum value of the second displacement.

The method for measuring displacements of an end effector may further include, when a change value in at least one of the pitch, roll and yaw of the end effector is a predetermined range or more, outputting an abnormality detection notification.

According to another aspect of the present disclosure, there is provided an apparatus for measuring displacements of an end effector passing through a load lock gate of an equipment front end module (EFEM), the apparatus including: at least one displacement sensor configured to measure a first displacement in a vertical direction and a second displacement in a horizontal direction of the end effector while the end effector passes through the load lock gate; and a processor configured to calculate changes in pitch and roll of the end effector based on the measured first displacement, and calculate a change in yaw of the end effector based on the measured second displacement.

The displacement sensor may include: a first displacement sensor installed on an upper surface or a lower surface of the load lock gate to measure the first displacement of the end effector; and a second displacement sensor installed on a lateral surface of the load lock gate to measure the second displacement of the end effector.

The first displacement sensor may be installed on the upper surface or the lower surface of the load lock gate to measure a vertical displacement on one side of the end effector in a width direction, and the second displacement sensor may be installed on a lateral surface far from the first displacement sensor among both lateral surfaces of the load lock gate.

The process may calculate the change in the pitch (Pitch(θ)) by Equation 1 below:

$$\text{Pitch}(\theta) = \sin^{-1}(b/a) \qquad \text{[Equation 1]}$$

wherein, 'a' may denote a detection distance from a point in time when the detection of the end effector by the first displacement sensor starts to a point in time when the detection ends, and 'b' may denote a maximum value of the first displacement.

The process may calculate the change in the roll (Roll(θ)) by Equation 2 below:

$$\text{Roll}(\theta) = \tan^{-1}(c/b) \qquad \text{[Equation 2]}$$

wherein, 'c' may denote a horizontal distance between the first displacement sensor and the second displacement sensor, and 'b' may denote a maximum value of the first displacement.

The process may calculate the change in the yaw (Yaw(θ)) by Equation 3 below:

$$\text{Yaw}(\theta) = \sin^{-1}(e/d) \qquad \text{[Equation 3]}$$

wherein, 'd' may denote a detection distance from a point in time when the detection of the end effector by the second displacement sensor starts to a point in time when the detection ends, and 'e' may denote a maximum value of the second displacement.

When a change value in at least one of the pitch, roll and yaw of the end effector is a predetermined range or more, outputting an abnormality detection notification, the processor may output an abnormality detection notification.

According to another aspect of the present disclosure, there is provided an apparatus for measuring displacements of an end effector passing through a load lock gate of an equipment front end module (EFEM), the apparatus including: a first displacement sensor installed on an upper surface or a lower surface of the load lock gate so to be perpendicular to a movement path of the end effector passing through the load lock gate, and a second displacement sensor installed on a lateral surface of the load lock gate, wherein the first displacement sensor and the second displacement sensor are configured to measure a first displacement in a vertical direction and a second displacement in a horizontal direction of the end effector while the end effector passes through the load lock gate; and a process configured to, on the basis of a detection distance from a point in time when the detection of the end effector by the first displacement sensor starts to a point in time when the detection ends, a horizontal distance between the first displacement sensor and the second displacement sensor, and a maximum value of the first displacement, calculate changes in pitch and roll of the end effector, and, on the basis of a detection distance from a point in time when the detection of the end effector by the second displacement sensor starts to a point in time when the detection ends, and a maximum value of the second displacement, calculate a change in yaw of the end effector.

The first displacement sensor may be installed on the upper surface or the lower surface of the load lock gate to measure a vertical displacement on one side of the end effector in a width direction, and the second displacement sensor may be installed on a lateral surface far from the first displacement sensor among both lateral surfaces of the load lock gate.

The process may calculate the change in the pitch (Pitch(θ)) by Equation 1 below:

$$\text{Pitch}(\theta) = \sin^{-1}(b/a) \qquad \text{[Equation 1]}$$

wherein, 'a' may denote a detection distance from a point in time when the detection of the end effector by the first displacement sensor starts to a point in time when the detection ends, and 'b' may denote a maximum value of the first displacement.

The process may calculate the change in the roll (Roll(θ)) by Equation 2 below:

$$\text{Roll}(\theta) = \tan^{-1}(c/b) \qquad \text{[Equation 2]}$$

wherein, 'c' may denote a horizontal distance between the first displacement sensor and the second displacement sensor, and 'b' may denote a maximum value of the first displacement.

The process may calculate the change in the yaw (Yaw(θ)) by Equation 3 below:

$$\text{Yaw}(\theta) = \sin^{-1}(e/d) \qquad \text{[Equation 3]}$$

wherein, 'd' may denote a detection distance from a point in time when the detection of the end effector by the second displacement sensor starts to a point in time when the detection ends, and 'e' may denote a maximum value of the second displacement.

When a change value in at least one of the pitch, roll and yaw of the end effector is a predetermined range or more, outputting an abnormality detection notification, the processor may output an abnormality detection notification.

In accordance of the method and apparatus for measuring displacements of an end effector according to embodiments of the technical idea of the present disclosure, it is possible to more simply, objectively, and accurately detect changes in the positions of the end effector.

Effects which may be acquired by the method and apparatus for determining the status of a robot of the technical idea of the present disclosure are not limited to the above-mentioned effects, and other effects not mentioned herein will be clearly understood by persons having common knowledge in the technical field to which the present disclosure pertains from the description below.

BRIEF DESCRIPTION OF THE DRAWINGS

The above and other objects, features and other advantages of the present invention will be more clearly understood from the following detailed description taken in conjunction with the accompanying drawings, in which:

FIG. 8 is a flowchart illustrating a method for measuring displacements of an end effector (hereinafter, also referred to as an 'end effector displacement measurement method') according to an embodiment of the technical idea of the present disclosure.

DETAILED DESCRIPTION

Figure 1:
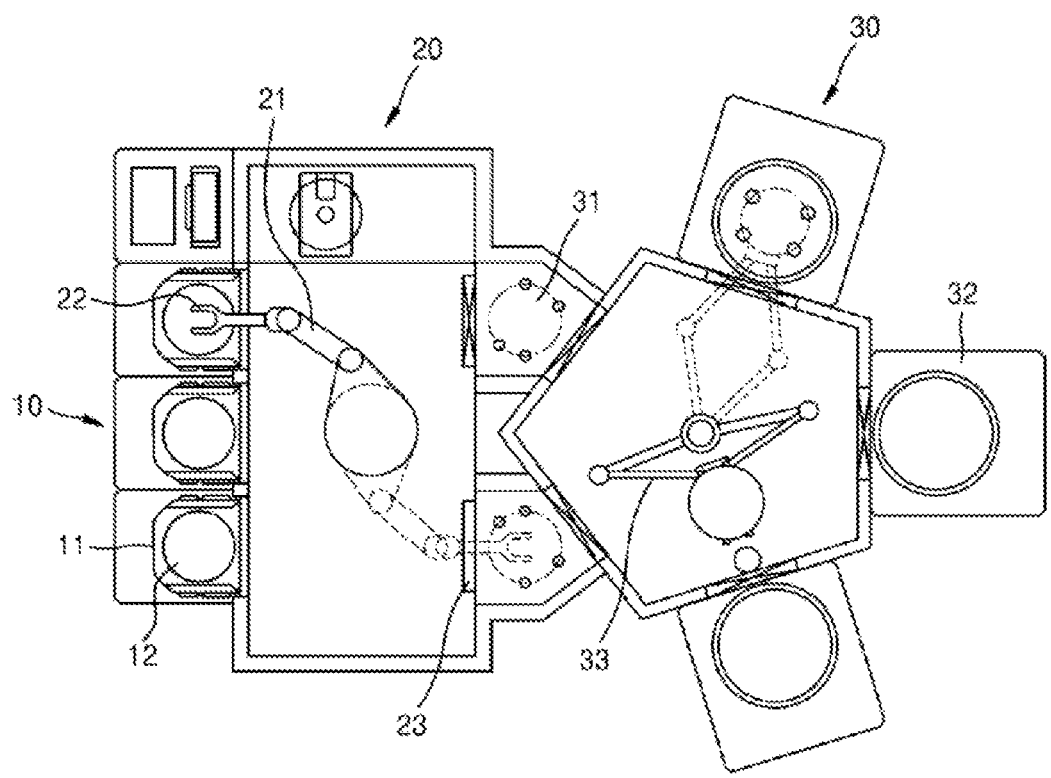
FIG. 1 is a view for describing a semiconductor process system using a typical wafer.

Since the technical idea of the present disclosure may have various changes and may have various embodiments, specific embodiments will be illustrated in the drawings and described in detail. However, it is not intended to limit the technical idea of the present disclosure to the specific embodiments, and it should be understood by those skilled in the art that the present invention includes all changes, equivalents, or substitutes included in the scope of the technical idea of the present disclosure.

In the description of the technical idea of the present disclosure, the publicly known functions and configurations related to the present disclosure, which are judged to be able to make the purport of the present invention unnecessarily obscure will not be described in detail. In addition, numbers (e.g., first, second, etc.) used in the description process of the present disclosure are only identification symbols for distinguishing one component from other components.

Further, in the present disclosure, it should be understood that when a component is referred to as being "connected to" or "coupled to" another component, the component can be "directly connected to" or "directly coupled to" the another component, but they can be directly connected or coupled to each other through another component in the middle, unless there is a description opposite thereto.

In addition, terms such as "-unit," "-device," "-member," "-module," and the like described in the present disclosure refer to a unit to execute at least one function or operation, which may be implemented by hardware or software such as a processor, a micro processor, micro controller, central processing unit (CPU), graphics processing unit (GPU), accelerate processor unit (APU), digital signal processor (DSP), application specific integrated circuit (ASIC), field programmable gate array (FPGA), or a combination of hardware and software.

In addition, a division of the configuration units in the present disclosure is intended for ease of description and divided only by the main function set for each configuration unit. That is, two or more of the configuration units to be described below may be combined into a single configuration unit or formed by two or more of divisions by function into more than a single configuration unit. Further, each of the configuration units to be described below may additionally perform a part or all of the functions among functions set for other configuration units other than being responsible for the main function, and a part of the functions among the main functions set for each of the configuration units may be exclusively taken and certainly performed by other configuration units.

Hereinafter, embodiments of the technical idea of the present disclosure will be described in detail in turn.

Figure 2:
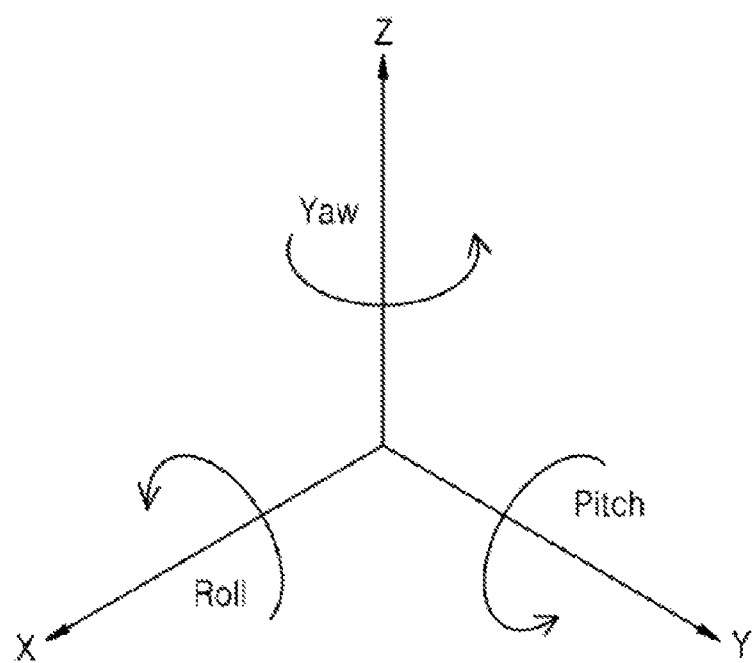
FIG. 2 is a diagram for describing rotational motions in a three-dimensional space.

FIG. 2 is a diagram for describing rotational motions in a three-dimensional space.

Referring to FIG. 2, rotation of an object in the three-dimensional space may be defined as rotational motions based on three axes perpendicular to each other.

For example, as shown in FIG. 2, the object can rotate about X, Y and Z axes perpendicular to each other. Herein, the rotation about the X axis may be defined as roll, the rotation about the Y axis may be defined as pitch, and the rotation about the Z axis may be defined as yaw. In addition, assuming that the object is moving in an X-axis direction, the pitch may be defined as a rotational motion about an axis in a horizontal plane perpendicular to the moving direction, the roll may be defined as a rotational motion about an axis in a horizontal plane parallel to the moving direction, and the yaw may be defined as a rotational motion about an axis in a plane perpendicular to the moving direction.

FIGS. 3A to 3D are views for describing changes in positions of the end effector.

In an end effector 22 installed at an end of a robot arm (21 in FIG. 5) for transferring a wafer, as shown in FIGS. 3A to 3D, changes in positions, that is, changes in the pitch, roll and yaw may occur, which are different from the status of the initially installed end effector 22.

Herein, the pitch may refer to a rotation about an axis in a horizontal plane perpendicular to a longitudinal direction (or forward moving direction) of the end effector 22, the roll may refer to a rotation about an axis in a horizontal plane parallel to the longitudinal direction of the end effector 22, and the yaw may refer to a rotation about an axis in a vertical plane perpendicular to the longitudinal direction of the end effector 22.

Figure 3A:
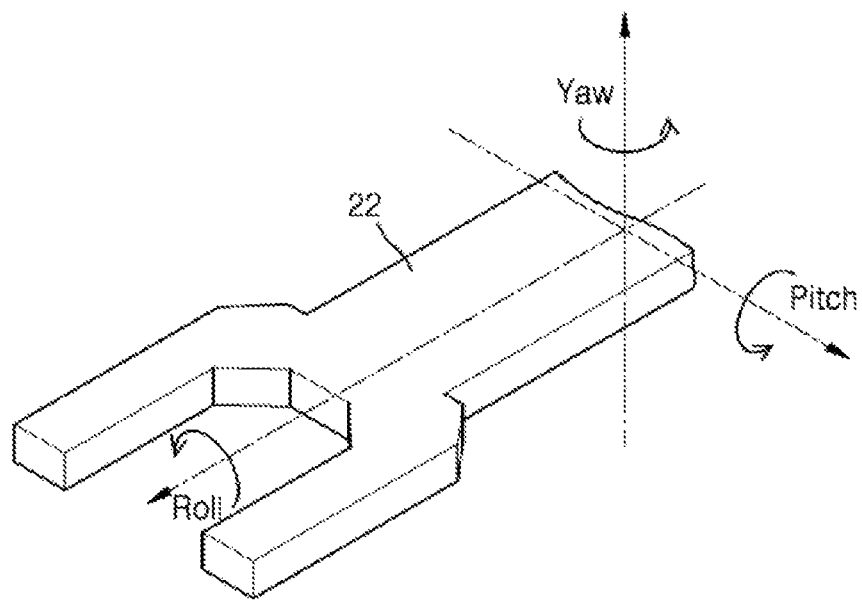
FIGS. 3A to 3D are views for describing changes in positions of the end effector.
Figure 3B:
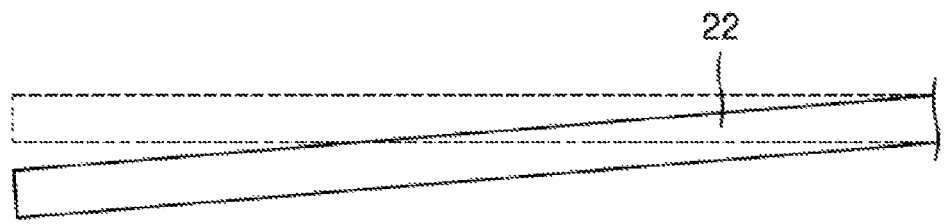

Due to the changes in the positions of the end effector 22, sagging and distortion in one direction may occur in the end effector 22. For example, if pitch is induced in the end effector 22, as shown in FIG. 3B, a phenomenon in which a front end of the end effector 22 sags downward may occur.

Figure 3C:
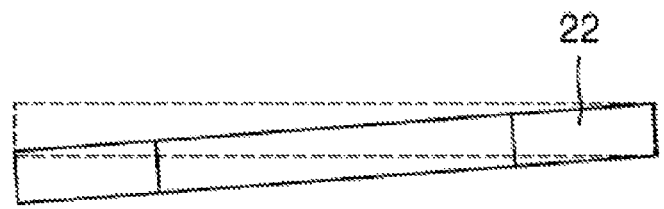
Figure 3D:
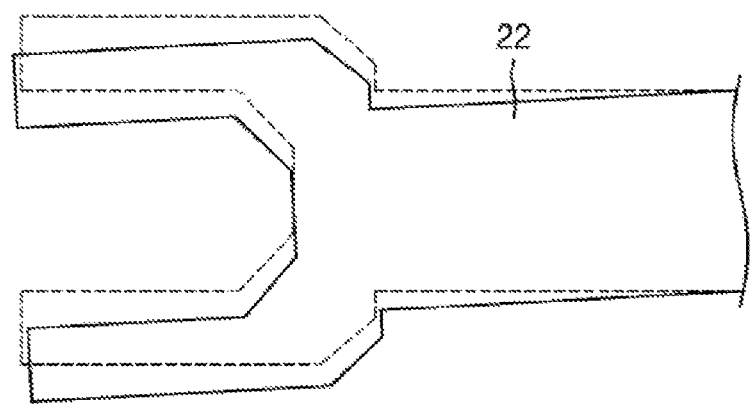

In addition, for example, if roll is induced in the end effector 22, as shown in FIG. 3C, a phenomenon in which one side of the end effector 22 in a width direction sags downward may occur. Further, for example, if yaw is induced in the end effector 22, as shown in FIG. 3D, a phenomenon in which the end effector 22 is distorted to one side may occur.

Hereinafter, an end effector displacement measurement apparatus capable of detecting an EFEM abnormality by calculating a degree of changes in the pitch, roll and yaw generated in the end effector 22 will be described in detail.

Figure 4:
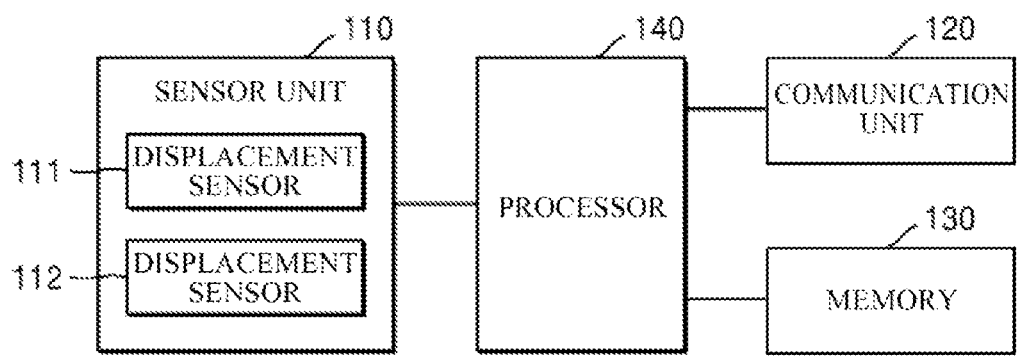
FIG. 4 is a block diagram illustrating a configuration of an apparatus for measuring displacements of an end effector (hereinafter, also referred to as an 'end effector displacement measurement apparatus') according to an embodiment of the technical idea of the present disclosure.

FIG. 4 is a block diagram illustrating a configuration of an end effector displacement measurement apparatus according to an embodiment of the technical idea of the present disclosure.

An end effector displacement measurement apparatus 100 may include a sensor unit 110, a communication unit 120, a memory 130 and a processor 140.

However, the components are not limited to the above-described example. For example, the end effector displacement measurement apparatus 100 may include more or fewer components than the above-described components. In addition, in one embodiment, each component may be installed in one physically identical apparatus, or at least some of the components may be installed spaced apart from each other in different apparatuses. Further, at least a portion of each component may be implemented in a form of one chip. In addition, in one embodiment, at least one of the communication unit 120, the memory 130 and the processor 140 may be included as a component in a controller or monitoring device for managing/controlling semiconductor equipment or semiconductor process systems such as EFEM (20 in FIG. 5).

The sensor unit 110 may measure the displacements of the end effector 22 passing through the load lock gate (23 of FIG. 5) provided in the semiconductor equipment such as the EFEM (20 of FIG. 5), for example. To this end, the sensor unit 110 may include at least one of displacement sensors 111 and 112 installed at different positions of the load lock gate (23 of FIG. 5) so as to be perpendicular to a movement path of the end effector 22.

In one embodiment, the displacement sensors 111 and 112 may include a first displacement sensor 111 configured to measure a first displacement of the end effector 22 and a second displacement sensor 112 configured to measure a second displacement of the end effector 22. Herein, the first displacement may be a vertical displacement of the end effector 22 and the second displacement may be a horizontal displacement of the end effector 22. The displacement sensors 111 and 112 may be, for example, laser displacement sensors including a laser light source and a light receiving element, but it is not limited thereto, and various displacement sensors may be applied according to embodiments.

The communication unit 120 may transmit/receive a signal to/from an external device. The signal transmitted and received with the external device may include control information and data. In this case, the external device may include a terminal, a server and the like. The communication unit 120 may include both wired and wireless communication units. In addition, the communication unit 120 may receive a signal through a wired/wireless channel and output it to the processor 140, and may transmit the signal output from the processor 140 through the wired/wireless channel.

The memory 130 may store programs and data necessary for an operation of the end effector displacement measurement apparatus 100. In one embodiment, the memory 130 may store control information or data included in the signal transmitted/received by the end effector displacement measurement apparatus 100. The memory 130 may be configured as a storage medium such as a ROM, a RAM, a hard disk, a CD-ROM and a DVD, or a combination of the storage media. In addition, a plurality of memories 130 are provided.

The processor 140 may control a series of processes in which the end effector displacement measurement apparatus 100 operates. For example, the processor 140 may control the components of the end effector displacement measurement apparatus 100 to perform the operation according to an embodiment of the present disclosure. A plurality of processors 140 may be provided, and the processor 140 may perform the operation of the end effector displacement measurement apparatus 100 by executing the program stored in the memory 130.

In one embodiment, the processor 140 may calculate changes in the positions of the end effector 22, i.e., a change in at least one of pitch, roll and yaw, based on the displacement measurement results of the displacement sensors 111 and 112. For example, the processor 140 may calculate change(s) in the pitch and/or roll based on a vertical displacement value of the end effector 22 measured by the first displacement sensor 111, and may calculate a change in the yaw based on a horizontal displacement value of the end effector 22 measured by the second displacement sensor 112. In this case, the change value(s) of the pitch, roll and/or yaw may be expressed as a rotation angle compared to the existing installation status based on each rotation axis.

A specific method for calculating the change in the position of the end effector 22 by the processor 140 will be described in detail with reference to FIGS. 8 and 9A to 9C.

In one embodiment, when the calculated change value of at least one of the pitch, roll and yaw of the end effector 22 is a predetermined reference range or more, the processor 140 may output an abnormality detection notification. According to an embodiment, the processor 140 may determine whether to output the abnormality detection notification by giving different priorities to each of the pitch, roll and yaw. That is, for example, the processor 140 may differently set a reference range for determining whether to output the abnormality detection notification for each of the pitch, roll and yaw based on an input from a user or the like.

In one embodiment, the processor 140 may transmit the calculated change value(s) of the pitch, roll and/or yaw in real time or periodically according to the input from the user or a request signal from the external device.

In one embodiment, the processor 140 may store data on the displacements of the end effector 22 measured by the displacement sensors 111 and 112 and change values of the pitch, roll and yaw calculated based on the displacements together with process conditions, etc. In addition, the processor 140 may predict a life-time and/or an exchange period of the end effector 22 according to process conditions, etc. based on the accumulated data.

Figure 5:
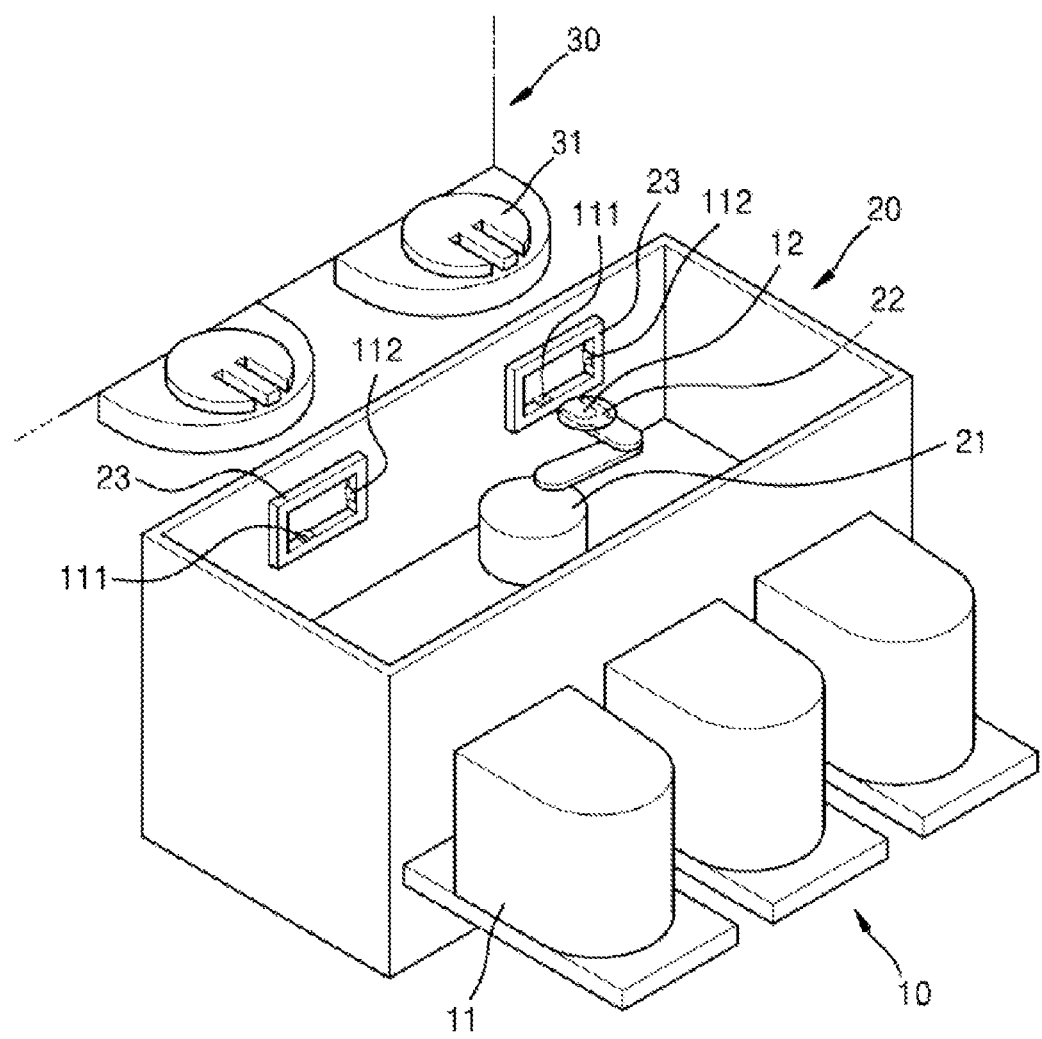
FIGS. 5 to 7 are views for describing an example of installing displacement sensors in an EFEM according to an embodiment of the technical idea of the present disclosure.
Figure 6:
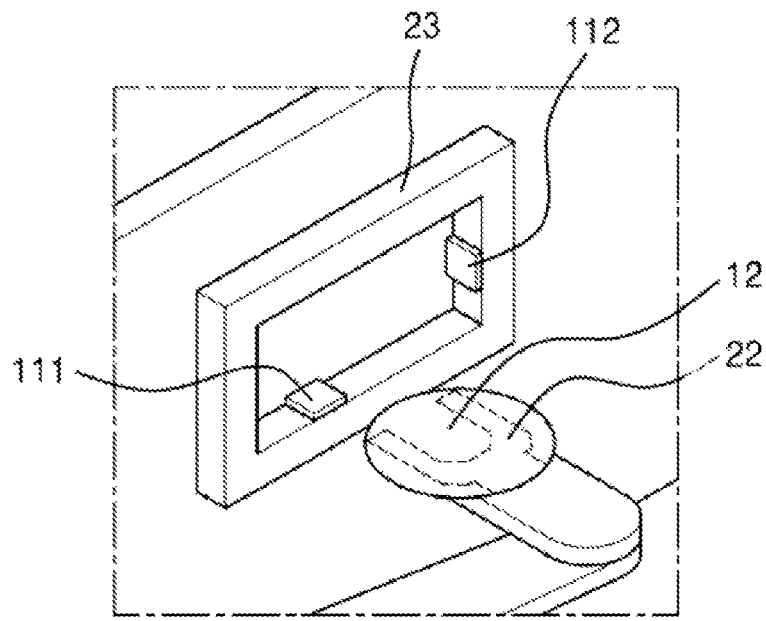
Figure 7:
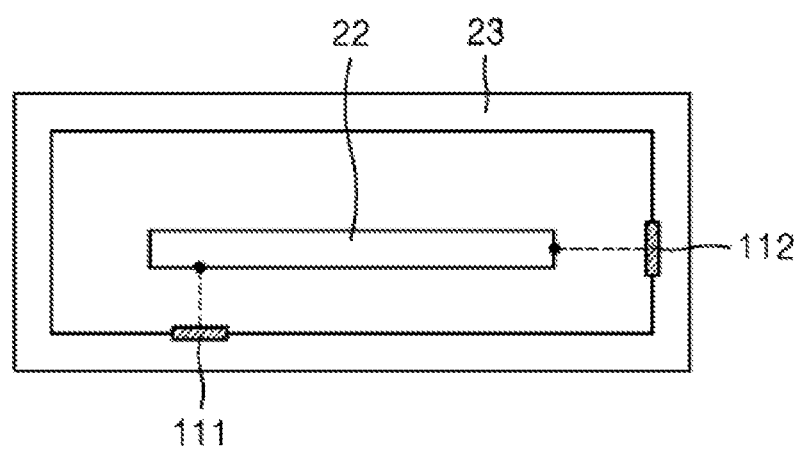

FIGS. 5 to 7 are views for describing an example of installing displacement sensors in an EFEM according to an embodiment of the technical idea of the present disclosure.

Referring to FIGS. 5 to 7, the displacement sensors 111 and 112 of the end effector displacement measurement apparatus 100 may be installed on upper, lower and/or lateral surface of the load lock gate 23 so as to be perpendicular to the movement path of the end effector 22 passing through the load lock gate 23.

In one embodiment, the first displacement sensor 111 may be installed on the upper surface or lower surface of the load lock gate 23 to measure the vertical displacement of the end effector 22. For example, the first displacement sensor 111 may be installed on the lower surface of the load lock gate 23, and may be configured to be aligned with one side in the width direction of the end effector 22 passing through the load lock gate 23 so as to detect the longest distance between the end effector 22 and the wafer 12 mounted thereon in consideration of the set movement path of the end effector 22. Thereby, the measured vertical displacement value may be used to simultaneously calculate the pitch and the roll, and calculation accuracy for the changes in the pitch and the roll may be further increased.

In one embodiment, the second displacement sensor 112 may be installed on the lateral surface of the load lock gate 23 to measure the horizontal displacement of the end effector 22. For example, the second displacement sensor 112 may be installed at a height corresponding to the end effector 22 passing through the load lock gate 23 in consideration of the set movement path of the end effector 22, and may be configured so as to be installed on the lateral surface further away from the first displacement sensor 111 among both lateral surfaces of the load lock gate 23.

Figure 9A:
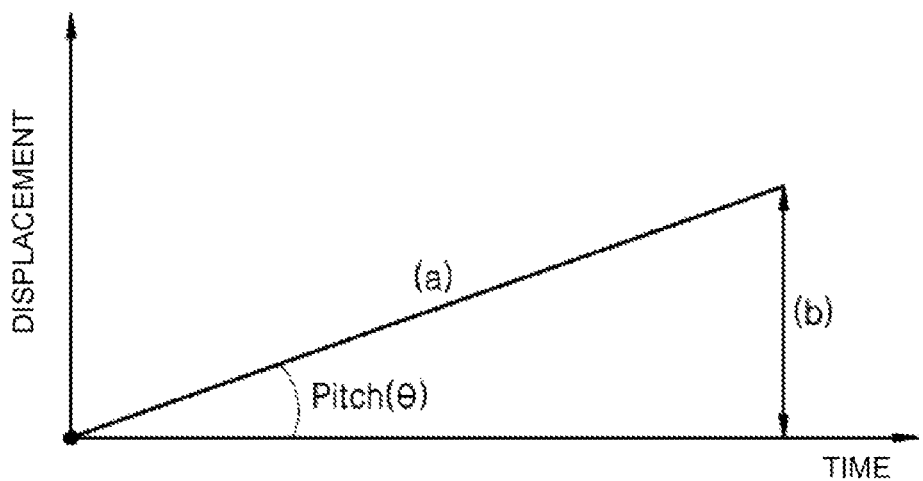
FIGS. 9A to 9C are diagrams for describing a method for performing step 820 of FIG. 8.
Figure 9B:
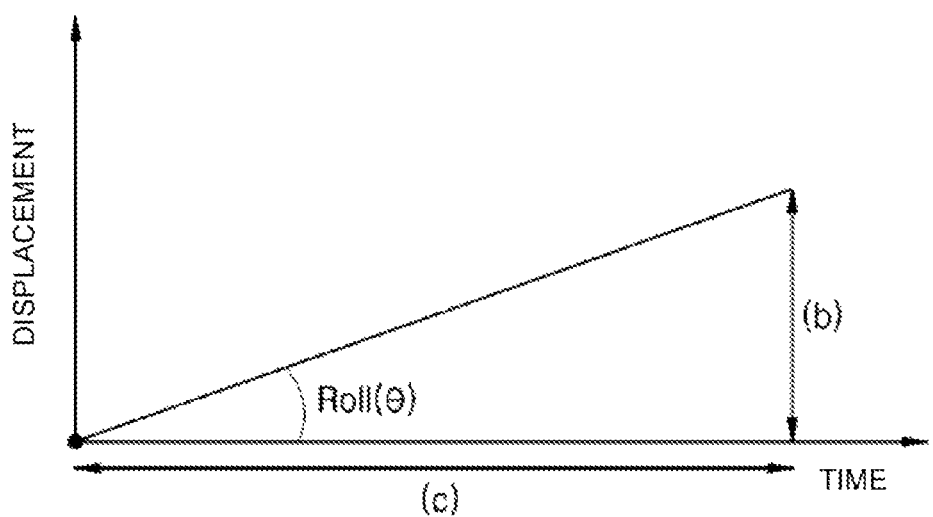
Figure 9C:
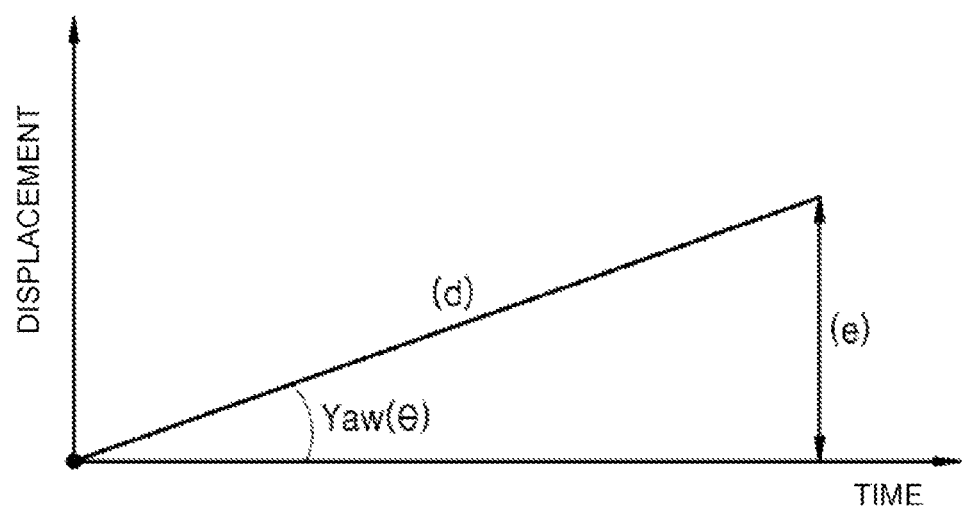

FIG. 8 is a flowchart illustrating an end effector displacement measurement method according to an embodiment of the technical idea of the present disclosure, and FIGS. 9A to 9C are diagrams for describing a method for performing step 820 of FIG. 8.

In step 810, the end effector displacement measurement apparatus 100 may first measure the displacement of the end effector 22 passing through the load lock gate 23 by the displacement sensors 111 and 112. For example, the first displacement sensor 111 installed on the lower surface of the load lock gate 23 may measure the first displacement (i.e., vertical displacement) of the end effector 22, and the second displacement sensor 112 installed on the lateral surface of the load lock gate 23 may measure the second displacement (i.e., horizontal displacement) of the end effector 22.

In this case, the detection period and/or number of the displacement sensors 111 and 112 may be set to correspond to the length and width of the end effector 22, which are displacement measurement targets.

Then, in step 820, the end effector displacement measurement apparatus 100 may calculate a change in at least one of the pitch, roll and yaw of the end effector 22 based on the displacement measurement results.

In one embodiment, as shown in FIG. 9A, the end effector displacement measurement apparatus 100 may calculate a change value of the pitch of the end effector 22 based on the value measured by the first displacement sensor 111.

For example, the apparatus may calculate the change in the pitch (Pitch(θ)) by Equation 1 below:

$$\text{Pitch}(\theta) = \sin^{-1}(b/a) \qquad \text{[Equation 1]}$$

wherein, 'a' may denote a distance at which the first displacement sensor 111 can detect the vertical displacement of the end effector 22 according to the movement of the end effector 22. That is, as the end effector 22 enters an inside of the load lock gate 23, 'a' may mean a distance from a point in time when the detection of the end effector 22 by the first displacement sensor 111 starts and a point in time when the detection ends, or a detection length of the first displacement sensor 111 with respect to the end effector 22 and the wafer 12, which are measurement targets.

In one embodiment, 'a' may be calculated by the following equation:

(Moving speed of end effector 22)×{(Point in time when detection of end effector 22 by first displacement sensor 111 ends (Off time))−(Point in time when the end effector 22 is detected by first displacement sensor 111 (On time))}.

In addition, 'b' may denote a maximum value of the vertical displacement measured by the first displacement sensor 111. For example, when the first displacement sensor 111 is installed on the lower surface of the load lock gate 23 and the front end of the end effector 22 sags downward at a constant inclination, as the end effector 22 enters the inside of the load lock gate 23, the vertical displacement measured by the first displacement sensor 111 is linearly increased, and may be the maximum value in the final measurement.

That is, the end effector displacement measurement apparatus 100 may calculate an angle of change in the pitch, using the detection distance of the first displacement sensor 111 with respect to the end-effector 22 and the wafer 12 and the maximum value of the vertical displacement measured at the final detection time through an arcsine.

Further, in one embodiment, as shown in FIG. 9B, the end effector displacement measurement apparatus 100 may calculate a change value of the roll of the end effector 22 based on the value measured by the first displacement sensor 111.

For example, the roll change value (Roll(θ)) may be calculated by Equation 2 below:

$$\text{Roll}(\theta) = \tan^{-1}(c/b) \qquad \text{[Equation 2]}$$

wherein, 'c' may denote a distance of the second displacement sensor 112 spaced apart from the first displacement sensor 111 in the horizontal direction.

That is, the end effector displacement measurement apparatus 100 may calculate an angle of change in the roll, using the horizontal distance between the first displacement sensor 111 and the second displacement sensor 112 and the maximum value of the vertical displacement measured at the final detection time through an arctangent.

Further, in one embodiment, as shown in FIG. 9C, the end effector displacement measurement apparatus 100 may calculate a change value of the yaw of the end effector 22 based on the value measured by the second displacement sensor 112.

For example, the change in the yaw (Yaw(θ)) may be calculated by Equation 3 below:

$$\text{Yaw}(\theta) = \sin^{-1}(e/d) \qquad \text{[Equation 3]}$$

wherein, 'd' may denote a distance at which the second displacement sensor 112 may detect the horizontal displacement of the end effector 22 according to the movement of the end effector 22. That is, as the end effector 22 enters the inside of the load lock gate 23, 'd' may mean a distance from a point in time when the detection of the end effector 22 by the second displacement sensor 112 starts and a point in time when the detection ends, or a detection length of the second displacement sensor 112 with respect to the end effector 22 and the wafer 12, which are measurement targets.

In one embodiment, 'd' may be calculated by the following equation:

(Moving speed of end effector 22)×{(Point in time when detection of end effector 22 by second displacement sensor 112 ends (Off time))− (Point in time when the end effector 22 is detected by second displacement sensor 112 (On time))}.

In addition, 'e' may denote the maximum value of the horizontal displacement measured by the second displacement sensor 112. For example, when the second displacement sensor 112 is installed on the lateral surface of the load lock gate 23 and the front end of the end effector 22 is distorted at a constant inclination toward a side opposite to the second displacement sensor 112, as the end effector 22 enters the inside of the load lock gate 23, the horizontal displacement measured by the second displacement sensor 112 is linearly increased, and may be the maximum value in the final measurement.

That is, the end effector displacement measurement apparatus 100 may calculate an angle of change in the yaw, using the detection distance of the second displacement sensor 112 with respect to the end-effector 22 and the wafer 12 and the maximum value of the horizontal displacement measured at the final detection time through an arcsine.

However, the above-described calculation method is exemplary, such that it is not limited thereto, and may be variously modified and applied according to embodiments.

Thereafter, in step 830, when the calculated change value of at least one of the pitch, roll and yaw of the end effector 22 is the predetermined reference range or more, the end effector displacement measurement apparatus 100 may output an abnormality detection notification.

For example, the output of the abnormality detection notification may be performed by displaying the calculated change value and the abnormality detection notification on a display device provided in the semiconductor equipment such as EFEM (20 of FIG. 5) and/or the semiconductor process system in a predetermined manner, or by transmitting the change value and anomaly detection notification to the external device such as a terminal or a server connected thereto through wired or wireless communication. Based on this notification, the user may recognize the degree of deformation of the end effector 22 and determine whether to replace it. In addition, according to an embodiment, the end effector displacement measurement apparatus 100 may be implemented to transmit the calculated change value(s) of the pitch, roll and/or yaw in real time or periodically according to an input from the user or a request signal from the external device.

In one embodiment, the end effector displacement measurement apparatus 100 may give different priorities to each of the pitch, roll and yaw based on the input or setting of the user. For example, in the case of the pitch, the reference range may be set lower than that of the roll and/or yaw since the effect on the process is large.

Meanwhile, although not shown in the drawings, in one embodiment, the end effector displacement measurement method 800 may further include: storing displacements (i.e., vertical displacement and horizontal displacement) of the end effector 22 measured by the displacement sensors 111 and 112 and/or a change value of at least one of the pitch, roll and yaw calculated based on the displacements corresponding to process conditions etc.; and predicting a lifetime and/or replacement cycle of the end effector 22 according to process conditions based on the accumulated data on the displacements of the end effector 22 and/or the change value of at least one of the pitch, roll and yaw.

The end effector displacement measurement method 800 according to an embodiment may be implemented in a form of a program command that may be executed through various computer means to be recorded in a computer readable medium. The computer readable medium may include program commands, data files, data structures, and the like alone or in combination thereof. The program commands recorded in the medium may be specially designed and configured for the present invention, or may be publicly known to and used by those skilled in the software field. Examples of the computer readable recording medium include magnetic media such as hard disks, floppy disks and magnetic tapes, optical media such as CD-ROMs and DVDs, magneto-optical media such as floppy disks, and a hardware device which is specifically configured to store and perform the program command such as a ROM, a RAM, a flash memory and the like. Examples of the program command includes a high-level language code executable by a computer using an interpreter, and the like, as well as a machine language code created by a compiler.

In addition, a system for providing a service type function according to the disclosed embodiments or an operation method for the system may be provided by being included in a computer program product. The computer program product may be traded between sellers and buyers as goods.

The computer program product may include an S/W program and a computer readable storage medium in which the S/W program is stored. For example, the computer program product may include goods (e.g., downloadable apps) in a form of S/W programs distributed electronically through manufacturers of electronic devices or electronic markets (e.g., Google Play Store, App Store). For electronic distribution, at least a portion of the S/W program may be stored in a storage medium or may be temporarily created. In this case, the storage medium may be a server of the manufacturer, a server of the electronic market, or a storage medium of a relay server temporarily storing the SW program.

In a system consisting of the server and a client device, the computer program product may include a storage medium of the server or a storage medium of the client device. Alternatively, when there is a third device (e.g., a smart phone) which is communicatively connected to the server or the client device, the computer program product may include a storage medium of the third device. Alternatively, the computer program product may include the S/W program itself which is transmitted from the server to the client device or the third device, or transmitted from the third device to the client device.

In this case, one of the server, the client device and the third device may execute the computer program product to perform the method according to the disclosed embodiments. Alternatively, two or more of the server, the client device, and the third device may execute the computer program product to execute the method according to the disclosed embodiments in a distributed manner.

For example, a server (e.g., a cloud server or an artificial intelligence server) may execute the computer program product stored in the server to control the client device communicatively connected with the server so as to perform the method according to the disclosed embodiments.

Although the embodiments have been described in detail above, the scope of the present invention is not limited to the embodiments, and various modifications and improvements by those skilled in the art using the basic concept of the present invention as defined in the following claims are also included in the scope of the present invention.

What is claimed is:

1. A method for measuring displacements of an end effector passing through a load lock gate of semiconductor equipment, the method comprising:
   measuring a first displacement in a vertical direction of the end effector by a first displacement sensor and a second displacement in a horizontal direction of the end effector by a second displacement sensor, while the end effector passes through the load lock gate;
   calculating changes in pitch and roll of the end effector based on a maximum value of the first displacement, a detection distance from a point in time when the detection of the end effector by the first displacement sensor starts to a point in time when the detection ends, and a horizontal distance between the first displacement sensor and the second displacement sensor; and calculating a change in yaw of the end effector based on a maximum value of the second displacement, and a detection distance from a point in time when the detection of the end effector by the second displacement sensor starts to a point in time when the detection ends.

2. The method according to claim 1, wherein the first displacement sensor is installed on an upper surface or a lower surface of the load lock gate and is configured to be aligned with one side in a width direction of the end effector passing through the load lock gate; and the second displacement sensor is installed on a lateral surface far from the first displacement sensor among both lateral surfaces of the load lock gate to correspond to a of the end effector passing through the load lock gate.

3. The method according to claim 1, wherein in the step of calculating the change in the pitch and the roll of the end effector, the change in the pitch (Pitch($\theta$)) is calculated by Equation 1 below:

$$\text{Pitch}(\theta) = \sin^{-1}(b/a) \qquad \text{[Equation 1]}$$

wherein, 'a' denotes the detection distance from a point in time when the detection of the end effector by the first displacement sensor starts to a point in time when the detection ends, and 'b' denotes the maximum value of the first displacement.

4. The method according to claim 1, wherein in the step of calculating the change in the pitch and the roll of the end effector, the change in the roll (Roll($\theta$)) is calculated by Equation 2 below:

$$\text{Roll}(\theta) = \tan^{-1}(c/b) \qquad \text{[Equation 2]}$$

wherein, 'c' denotes the horizontal distance between the first displacement sensor and the second displacement sensor, and 'b' denotes the maximum value of the first displacement.

5. The method according to claim 1, wherein in the calculating of the change in the yaw of the end effector, the change in the yaw (Yaw(0)) is calculated by Equation 3 below:

$$\text{Yaw}(\theta) = \sin^{-1}(e/d) \qquad \text{[Equation 3]}$$

wherein, 'd' denotes the detection distance from a point in time when the detection of the end effector by the second displacement sensor starts to a point in time when the detection ends, and 'e' denotes the maximum value of the second displacement.

6. The method according to claim 1, further comprising, when a change value in at least one of the pitch, roll and yaw of the end effector is a predetermined range or more, outputting an abnormality detection notification.

7. A apparatus for measuring displacements of an end effector passing through a load lock gate of an equipment front end module (EFEM), the apparatus comprising:

a first displacement sensor installed on an upper surface or a lower surface of the load lock gate so to be perpendicular to a movement path of the end effector passing through the load lock gate, and a second displacement sensor installed on a lateral surface of the load lock gate, wherein the first displacement sensor and the second displacement sensor are configured to measure a first displacement in a vertical direction and a second displacement in a horizontal direction of the end effector while the end effector passes through the load lock gate; and a process configured to, on the basis of a detection distance from a point in time when the detection of the end effector by the first displacement sensor starts to a point in time when the detection ends, a horizontal distance between the first displacement sensor and the second displacement sensor, and a maximum value of the first displacement, calculate changes in pitch and roll of the end effector, and, on the basis of a detection distance from a point in time when the detection of the end effector by the second displacement sensor starts to a point in time when the detection ends, and a maximum value of the second displacement, calculate a change in yaw of the end effector.

8. The apparatus according to claim 7, wherein the first displacement sensor is installed on the upper surface or the lower surface of the load lock gate and is configured to be aligned with one side in a width direction of the end effector passing through the load lock gate, and the second displacement sensor is installed on a lateral surface far from the first displacement sensor among both lateral surfaces of the load lock gate, to correspond to a height of the end effector passing through the load lock gate.

9. The apparatus according to claim 7, wherein the processor calculates the change in the pitch (Pitch($\theta$)) by Equation 1 below:

$$\text{Pitch}(\theta) = \sin^{-1}(b/a) \qquad \text{[Equation 1]}$$

wherein, 'a' denotes a detection distance from a point in time when the detection of the end effector by the first displacement sensor starts to a point in time when the detection ends, and 'b' denotes a maximum value of the first displacement.

10. The apparatus according to claim 7, wherein the processor calculates the change in roll Roll($\theta$) by Equation 2 below:

$$\text{Roll}(\theta) = \tan^{-1}(c/b) \qquad \text{[Equation 2]}$$

wherein, 'c' denotes a horizontal distance between the first displacement sensor and the second displacement sensor, and 'b' denotes a maximum value of the first displacement.

11. The apparatus according to claim 7, wherein the processor calculates the change in the yaw (Yaw(0)) by Equation 3 below:

$$\text{Yaw}(\theta) = \sin^{-1}(e/d) \qquad \text{[Equation 3]}$$

wherein, 'd' denotes a detection distance from a point in time when the detection of the end effector by the second displacement sensor starts to a point in time when the detection ends, and 'e' denotes a maximum value of the second displacement.

12. The apparatus according to claim 7, wherein, when a change value in at least one of the pitch, roll and yaw of the end effector is a predetermined range or more, the processor outputs an abnormality detection notification.

* * * * *